(12) United States Patent
Hagerman et al.

(10) Patent No.: US 6,219,821 B1
(45) Date of Patent: Apr. 17, 2001

(54) COMPUTERS SYSTEMS AND METHODS FOR VERIFYING REPRESENTATIONS OF A CIRCUIT DESIGN

(75) Inventors: John Hagerman, Boxford; Matthew Bellantoni, Belmont, both of MA (US); Richard J. Newton, II, Saratoga, CA (US); Richard J. Cloutier, Andover; Gerard Memmi, Cambridge, both of MA (US)

(73) Assignee: Chrysalis Symbolic Design, Inc., North Billerica, MA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/054,673

(22) Filed: Apr. 3, 1998

(51) Int. Cl.$^7$ .................................................. G06F 17/50
(52) U.S. Cl. ...................... 716/5; 716/3; 716/7; 707/103
(58) Field of Search ............................ 395/500.06; 716/5

(56) References Cited

U.S. PATENT DOCUMENTS

| 5,455,775 | * | 10/1995 | Huber et al. | 364/488 |
|---|---|---|---|---|
| 5,530,841 | | 6/1996 | Gregory et al. | 395/500 |
| 5,581,781 | | 12/1996 | Gregory et al. | 395/800 |
| 5,661,661 | | 8/1997 | Gregory et al. | 364/489 |
| 5,680,318 | | 10/1997 | Gregory et al. | 364/489 |
| 5,937,409 | * | 8/1999 | Wetherbee | 707/103 |
| 5,949,691 | | 9/1999 | Kurosaka et al. | 364/489 |

OTHER PUBLICATIONS

R.K. Blackett, As Good as Gold, IEEE Spectrum pp. 68–71, Jun. 1996.*

L.A. Crowl, Shared Memory Multiprocessors and Sequential Programming Languages: A Case Study, International Conference on System Sciences, pp. 103–108, Jan. 1988.*

(List continued on next page.)

*Primary Examiner*—Kevin J. Teska
*Assistant Examiner*—A. M. Thompson
(74) *Attorney, Agent, or Firm*—Hamilton, Brook, Smith & Reynolds, P.C.

(57) ABSTRACT

A design verification system verifies whether first and second representations of a circuit design match. The system includes a processor assembly and a memory that stores a first hierarchy of elements as the first representation of the design, a second hierarchy of elements as the second representation of the design, and a map entry that identifies a correspondence between an element of the first hierarchy and an element of the second hierarchy. The processor assembly performs a read operation that reads the map entry from the memory; a generate operation that generates other map entries according to the read map entry, the generated other map entries identifying other correspondences between the elements of the first hierarchy and the elements of the second hierarchy; a store operation that stores the generated other map entries in the memory such that the map entry and the generated other map entries form a set of map entries stored in the memory; and a compare operation that compares the first representation with the second representation according to the set of map entries. The result of a comparison between the first and second representations indicates whether the first representation matches with the second representation.

23 Claims, 9 Drawing Sheets

OTHER PUBLICATIONS

Design VERIFYer Version 2.4. Datasheet[online]. Chrysalis Symbolic Design, 1999 [retrieved in Nov. 21, 1999]. Retrieved from the Internet: <http://www.chrysalis.com/products/>.*

Design VERIFYer Datasheet[online]. Chrysalis Symbolic Design, 1999 [retrieved in Nov. 21, 1999]. Retrieved from the Internet: <http://www.chrysalis.com/products/>.*

"Chrysalis Announces Industry's First Full–Chip Formal Solution". [Online]. Chrysalis Symbolic Design, 1998 [retrieved on Nov. 23, 1999]. Retrieved from the Internet:<http://www.chrysalis.com/pr/solution_298.html>.*

"Cray Research Picks Design VERIFYer to Speed Development of New Supercomputer Line". [Online]. Chrysalis Symbolic Design, 1999 [retrieved in Dec. 01, 1999.] Retrieved from the Internet: <http://www.chrysalis.com/products/>.*

Newton, Richard, "Genmap v2.0 Documentation," Chrysalis Symbolic Design, Inc., pp. 1–11, Nov. 12, 1996.

* cited by examiner

COMPUTERS SYSTEMS AND METHODS FOR VERIFYING REPRESENTATIONS OF A CIRCUIT DESIGN

BACKGROUND OF THE INVENTION

The process of creating very-large-scale integrated (VLSI) circuit designs typically includes a structured sequence of steps. In an initial step, a VLSI circuit designer creates a computerized representation of a VLSI circuit design using a computerized tool. In the ensuing steps, the designer generates a series of subsequent representations using specialized tools including synthesis tools, optimization tools, and place-and-route tools. The designer might also generate a new representation manually using a computerized editing tool.

In general, each representation in the series describes the design at a different level of abstraction. It is common for the initial representation to describe the design at a high level of abstraction, and for each subsequent representation to describe the design at a respective lower level of abstraction. For example, the initial representation may describe the design at the register-transfer level (RTL), a subsequent representation may describe the design at the gate-level, and a subsequent representation from that may describe the design at the transistor-level. The process culminates with the generation of a database containing geometric detail of masks that will be used to fabricate the design.

A circuit design representation describes a design as a set of basic components or elements that are connected together. Due to the size and complexity of VLSI circuit designs, it is a common practice for the designer to group elements together in subsets called module definitions (or modules). A module defines an arrangement of elements and other modules, and can be instantiated more than once in a representation. That is, the designer creates a module once to define an arrangement of elements, and uses instances of that module to represent specific portions of the design. Many hardware description languages (HDLs) support this hierarchical manner of design description. Designs are written as a set of module definitions. Computerized tools that read such designs can construct the full hierarchical representation of the design from the module definitions. In the full hierarchical representation, each element of the design has a unique representation.

To insure that no unintended changes are introduced into a newly generated representation, particularly when manual modifications have been made, the designer applies a computerized verification tool to the newly generated representation and its predecessor. The verification tool verifies that particular design aspects such as functional behaviors are preserved from representation to representation. This verifying process commonly is referred to as "design verification." An example of such a tool is Design VERIFYer, which is marketed by Chrysalis Symbolic Design, Inc. of Billerica, Mass. Design VERIFYer verifies behavior preservation between first and second representations of a circuit design by finding matches between signals represented by the representations, and comparing the logic functions driving the signals.

The signals of each representation are identifiable by signal name. If two representations are at the same level of abstraction (e.g., before and after optimization at the gate level) the signal names typically are kept the same. Design VERIFYer has a "name based" mode that finds matches between signals of different representations by matching signal names.

If two representations are at different levels of abstraction (e.g., before and after RTL-to-gate synthesis) the signal names typically are changed in some uniform manner. It is common for a designer to use a signal name mapping tool that performs "rule-based signal matching"prior to running the design verification tool to account for such changes. The signal name matching tool refers to each signal in the representation by signal name, i.e., by a character string. The character string is a series of subnames separated by a delimiter ".". The last subname in the series uniquely identifies a signal within a particular element of the representation. The portion of the series up to but not including the last subname uniquely identifies the element within the representation that contains the signal.

Mapping rules describe how the signal names have changed from the first representation to the second representation. Each mapping rule consists of a keyword, a first subrule and a second subrule. The keyword indicates to the tool that the instruction is a mapping rule. The first subrule matches with signal names of the first representation, and the second subrule matches with signal names of the second representation. Each subrule includes one or more fields. A field can be a literal field that matches with a portion of a signal name character for character. Alternatively, a field can be a match field that matches with a portion of a name in a manner similar to that of %s or %d in scanf of the C programming language. The match fields of the first and second subrule are linked so that the same character string is matched by each match field.

The operation of the rule-based signal matching tool will now be described in further detail. First, the tool selects a mapping rule from the designer provided set of rules, and applies the mapping rule to a signal name of the first representation. In particular, the tool attempts to match the signal name with the first subrule. If the attempt is successful, i.e., if the signal name of the first representation matches the first subrule, the tool generates a signal name description according to the second subrule and the signal name that matches the first subrule. The tool then searches the second representation for a signal name fitting the signal name description. If the tool finds a signal name of the second representation matching the description, the tool stores the signal name of the first representation with the signal name of the second representation in a file as a mapped pair of signal names. The tool then applies the mapping rule to another signal name of the first representation, and repeats the generating/searching steps if the new name matches the first subrule. When the tool has applied the rule to all signal names of the first representation, the tool selects another mapping rule and applies it to signals of the first representation. When all mapping rules have been applied, the tool is finished. The design verification tool reads the mapped pairs of signal names from the file, and uses them to compare the first and second representations.

By way of example, suppose a design includes a clock signal and an instance of an input-output module. Additionally, the input-output module includes an acknowledge signal and two instances of a datapath module. Furthermore, each datapath module includes an output signal. In a first representation, the design has name "A", the clock signal has name "clk", the input-output module instance has name "IO", the acknowledge signal has name "ack", the first datapath module instance has name "DP1", the second datapath module instance has name "DP2", and the output signal has name "out". The full names (i.e., the design name, any module instance names, and the signal name, each name being delimited by ".") of the four signals are:

"A.clk"
"A.IO.ack"
"A.IO.DP1.out"
"A.IO.DP2.out"

In a second representation, the design has name "B", the input-output module instance has name "I_IO", the first datapath module instance has name "I_DP1", the second datapath module instance has name "I_DP2", and the signal names of the second representation have the same names as those of the first representation. The full names of the four signals are:

"B.clk"
"B.I_IO.ack"
"B.I_IO.I_DP1.out"
"B.I_IO.I_DP2.out"

In this example, the computerized tool that was used to produce the second representation from the first representation added the prefix "I_" to the names of the module instances of the first representation to generate the names of the module instances of the second representation.

The rule-based signal matching tool tries to match signal names of the first representation with signal names of the second representation. Since the signal names of the representations are different (by the "I_" prefix used in the second representation), the designer provides the tool with a set of mapping rules. In particular, to match the signal names "A.clk" and "B.clk", the designer provides the mapping rule:

$$\text{map\_signals A.\%s B.\%s} \qquad (1)$$

Here, "map_signals" is a keyword indicating that the instruction is a mapping rule. Each subrule includes a literal field and a match field. The first subrule includes "A." as its literal field, and "%s" as its match field. Similarly, the second subrule includes "B." as its literal field and "%s" as its match field. The match fields of the first and second subrules are linked so that the same character string is matched by both fields.

When the tool gets the signal name "A.clk" and applies mapping rule (1), the literal field "A." of the first subrule matches character for character with the "A." portion of the signal name, and the match field "%s" of the first subrule matches with the "clk" portion of the signal name. Accordingly, the tool generates a signal name description according to the subject signal name "A.clk" and the second subrule of mapping rule (1). In particular, the second subrule has a literal field "B." followed by a match field "%s" such that the description begins with the characters "B." and ends with characters from the link between the match fields of the first and second subrules, namely "clk". Accordingly, the generated description is "B.clk". The tool searches the second representation and finds that a signal name "B.clk" exists in the second representation. Accordingly, the tool has successfully matched the signal names "A.clk" and "B.clk". The tool then adds the pair of matched signal names to a line entry in a initial mapping file as part of the initial mapping.

An example of a conventional signal name matching tool is GENMAP, which is developed by Chrysalis Symbolic Design, Inc. for use in conjunction with Design VERIFYer. GENMAP generates an initial mapping file, and Design VERIFYer uses the initial mapping file to verify behavior preservation.

SUMMARY OF THE INVENTION

In the above described example, mapping rule (1) cannot be used to match the signal names "A.IO.ack" and "B.I_IO.ack". The first subrule matches with the first signal name, i.e., "A." matches the literal field, and "IO.ack" matches the match field. However, the signal name description generated from the second subrule and the signal name, "A.IO.ack", does not match the signal of the second representation. In particular, the generated signal name description is "B.IO.ack" which does not match the signal name of the second representation, namely "B.I_IO.ack". Accordingly, the designer needs to provide a second mapping rule to match the signal names "A.IO.ack" and "B.I_IO.ack". In particular, the designer provides:

$$\text{map\_signals A.\%s.\%s B.I\_\%s.\%s} \qquad (2)$$

Here, each subrule includes four fields. The first subrule includes a first literal field "A.", followed by a first match field "%s", followed by second literal field ".", followed by a second match field "%s". Similarly, the second subrule includes a first literal field "B.I_", followed by a first match field "%s", followed by second literal field ".", followed by a second match field "%s". The tool uses mapping rule (2) to match signal names "A.IO.ack" and "B.I_IO.ack". In this example, when the matching phase is complete, both pairs of signal names are included in the file for use during the comparing phase.

Similarly, mapping rules (1) and (2) cannot be used to match the signal names "A.IO.DP1.out" and "B.I_IO.I_DP1.out". In particular, the first subrule of mapping rule (1) matches with the signal name, "A.IO.DP1.out", of the first representation. However, the signal name description generated by mapping rule (1) and the signal name of the first representation is "B.IO.DP1.out", which does not match the signal name of the second representation. Similarly, the first subrule of mapping rule (2) matches with the signal name, "A.IO.DP1.out", of the first representation. However, the signal name description generated by mapping rule (2) and the signal name of the first representation is "B.I_IO.DP1.out", which does not match the signal name of the second representation.

In order to match the signal names "A.IO.DP1.out" and "B.I_IO.I_DP1.out", the designer must provide a third mapping rule. The designer provides:

$$\text{map\_signals A.\%s.\%s.\%s B.I\_\%s.I\_\%s.\%s} \qquad (3)$$

The first subrule of mapping rule (3) matches with "A.IO.DP1.out". Furthermore, the signal name description generated using mapping rule (3) and "A.IO.DP1.out" is "B.I_IO.I_DP1.out", which matches the signal name of the second representation.

It should be understood that, for certain types of changes between two representations, such as adding the prefix "I_" to the module instance names of signal names having varying numbers of module instance names, the conventional signal name matching tool requires multiple mapping rules to map the signal names correctly. For example, as shown above, the conventional tool uses a first mapping rule to map signal names that include one module instance name (e.g., "A.IO.ack" to "B.I_IO.ack" using mapping rule (2)), a second mapping rule to map signal names that include two module instance names (e.g., "A.IO.DP1.out" and "B.I_IO.I_DP1.out" using mapping rule (3)), and so on.

In contrast, the present invention can use a single mapping rule to match representations when a single change has been made such as adding a prefix to module instance names of signal names having varying numbers of module instance names. Such representation matching uses a mapping technique that involves generating a set of map entries according to an initial map entry. Each representation is a hierarchically arranged set of elements representing module instances and signals. Each map entry identifies a correspondence between elements of the representations. The initial map entry is used as a starting point for mapping the representations.

In a preferred embodiment, the mapping technique is integrated in a design verification system. The design verification system includes memory that stores a program, a first hierarchy of elements as the first representation of the design, a second hierarchy of elements as the second representation of the design, and a map entry that identifies a correspondence between an element of the first hierarchy and an element of the second hierarchy. The design verification system further includes processing circuitry that reads and executes the program. As the processing circuitry executes the program, the processing circuitry performs the following operations: a read operation that reads the map entry from the memory; a generate operation that generates other map entries according to the read map entry, and stores the generated other map entries in the memory such that the map entry and the generated other map entries form a set of map entries stored in the memory, the generated other map entries identifying other correspondences between the elements of the first hierarchy and the elements of the second hierarchy; and a compare operation that compares the first representation with the second representation according to the set of map entries. A result of a comparison between the first and second representations indicates whether the first representation matches with the second representation.

The integration of the mapping technique in the design verification system enables operations such as the generate and compare operations to be well adapted to each other. Furthermore, such integration makes the conventional steps of generating an initial mapping file and reading the initial mapping file unnecessary.

According to an embodiment of the invention, the system supports mapping rules having wildcard patterns. When the system encounters a rule having a wildcard pattern, the system attempts to match the wildcard pattern with zero or more subnames. The invention uses a path identified by any subnames matched by patterns up through the wildcard pattern to form a path of the second hierarchy. In this way a mapping rule having a wildcard maps elements at all hierarchy depths.

BRIEF DESCRIPTION OF THE DRAWINGS

The foregoing and other objects, features and advantages of the invention will be apparent from the following more particular description of the invention, as illustrated in the accompanying drawings in which like reference characters refer to the same parts through the different views. The drawings are not necessarily to scale, emphasis instead being placed upon illustrating the principles of the invention.

DETAILED DESCRIPTION OF THE INVENTION

The present invention enables VLSI circuit designers to perform a design verification procedure on representations of a VLSI circuit design. In particular, the invention enables designers to determine whether certain design aspects such as functional behavior are preserved between a first representation and a second representation of the design. To this end, a computer process generates a set of map entries from the representations and from a map entry that has been previously stored in the computer's memory, and stores the map entries in the memory. The computer compares the representations according to the map entries stored in the memory to determine whether the representations match.

Figure 1:
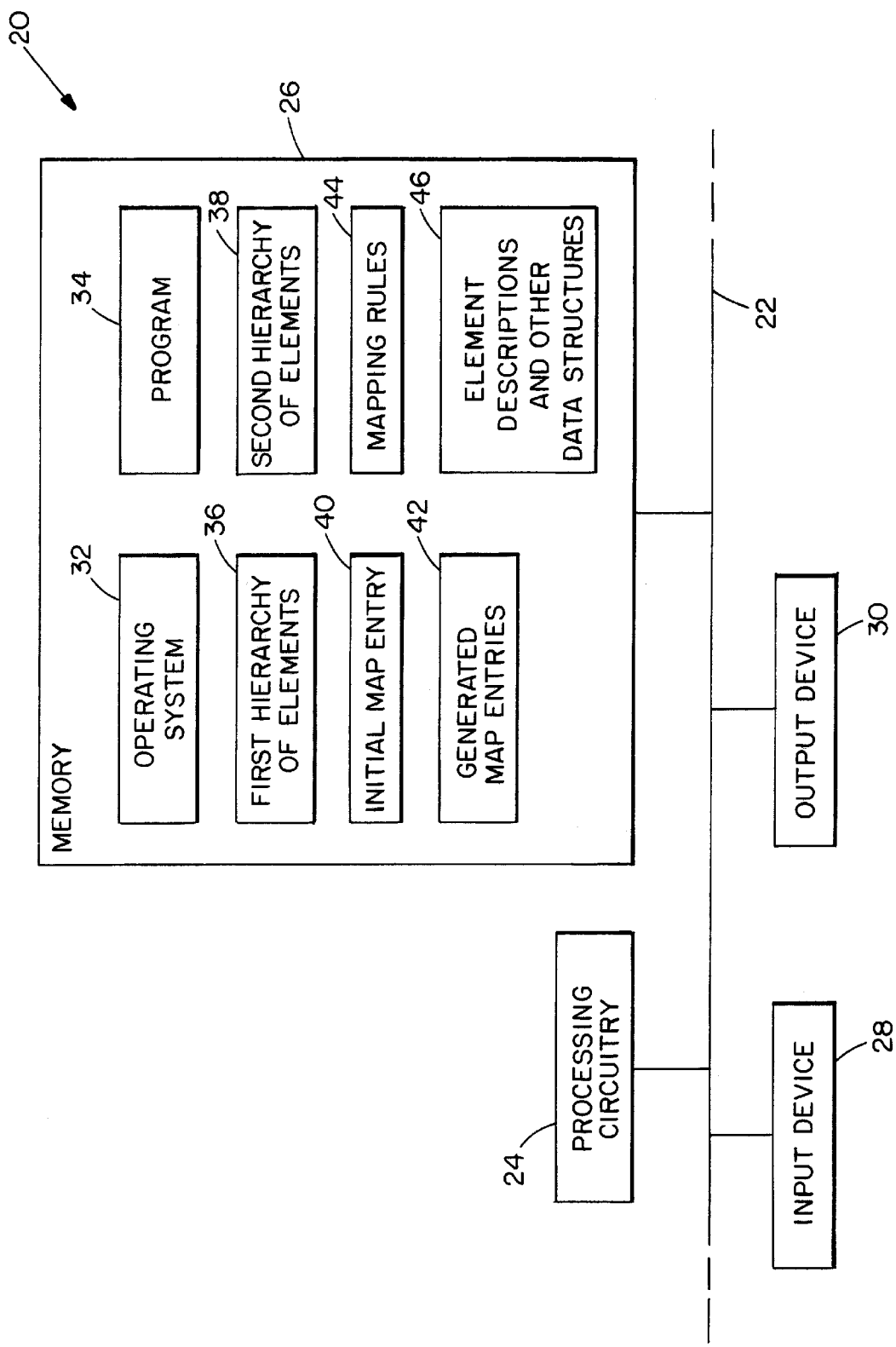
FIG. 1 is a block diagram of a general purpose computer that is suitable for use by the invention.

A general purpose computer, such as that illustrated in FIG. 1, is suitable for the invention. The computer 20 includes a computer bus 22 and several connected working components including processing circuitry 24, memory 26, an input device 28, and an output device 30. The components communicate with each other by passing commands and data digitally through the bus 22. The memory 26 provides storage for the computer 20, and stores an operating system 32 and a design verification program 34. The processing circuitry 24 runs the operating system 32 and the program 34 by reading and executing instructions of the operating system 32 and the program 34. A user can control the operation of the computer 20 using the input 28 and output 30 devices. In particular, the user enters commands and data using the input device 28 to start, control and stop execution of the design verification program 34. Additionally, the user uses the output device 30 to receive feedback and other information such as a design verification result indicating whether the first representation matches with the second representation.

In addition to storing the operating system 32 and design verification program 34, the memory 26 of the computer stores a set of data structures including a first hierarchy of elements 36 that forms the first representation of the design, a second hierarchy of elements 38 that forms the second representation of the design, and an initial map entry 40 that indicates a correspondence between an element of the first hierarchy and an element of the second hierarchy. The memory 26 further stores (i) map entries 42 that are generated by the processing circuitry executing program 34, (ii) mapping rules 44, and (iii) other structures 46 such as element descriptions that are used while the computer runs the design verification program 34.

It should be understood that the memory 26 generally refers to the storage used by the computer 20 including primary memory (e.g., volatile semiconductor memory that is accessed quickly such as cache memory and registers) and secondary memory (e.g., non-volatile memory that is accessed more slowly such as disks, tape, CD-ROM, and memory distributed over a network). It should be understood further that the computer 20 may include other components such as a network device and additional input/output devices.

Other computer configurations are suitable and within the purview of one skilled in the art.

Figure 2:
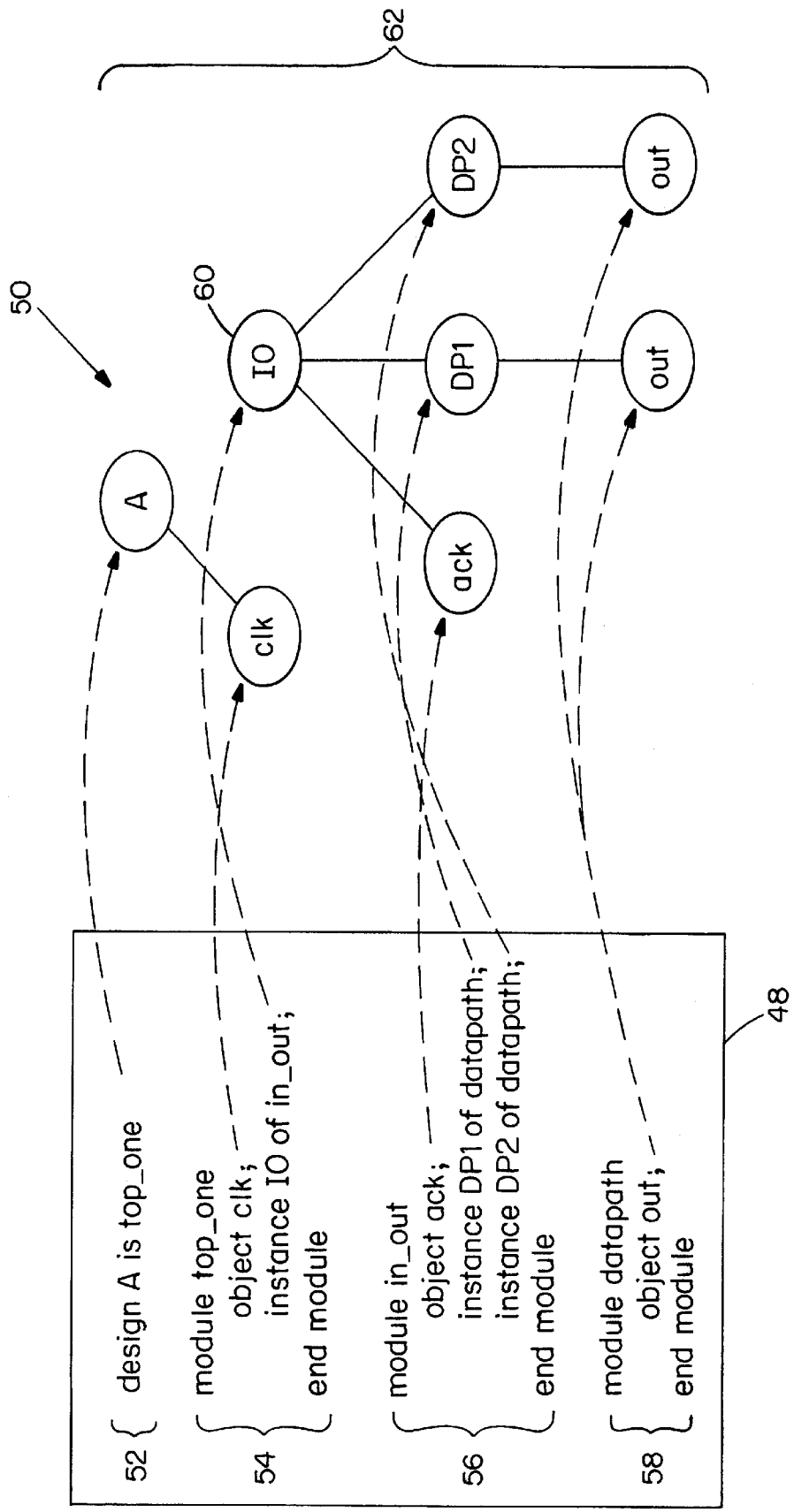
FIG. 2 is a diagram showing correspondences between a text-based representation of a design and a hierarchical diagram of the design.

The design representations that are matched and compared by the invention program 34 may be at various levels of abstraction such as at the transistor-level, gate-level or register-transfer level. The left side of FIG. 2 shows, by way of example, a text-based file 48 that includes a modularized description of a design 50 that is suitable for use by the invention. The textfile 48 includes a list of definitions that define elements (e.g., electronic components such as resistors or transistors). In particular, the textfile 48 includes a design definition 52 indicating that a design called "A" is of a module-type called "top_one". The textfile 48 further includes a module definition 54 indicating that the module "top_one" includes, as elements, an object called "clk", and an instance of a module called "IO" which is of a module-type called "in_out". The textfile 48 further includes a module definition 56 indicating that the module "in_out" includes an object "ack", and module instances "DP1" and "DP2" which are of a module-type called "datapath". The textfile 48 further includes a module definition 58 indicating that the module "datapath" includes an object "out".

The invention operates on design representations that are in the form of hierarchically arranged elements 60. When a representation is provided to the invention program 34 in a form that is not a set of hierarchically arranged elements, the invention processes data from the given input files and generates a set of elements that are arranged hierarchically.

The right side of FIG. 2 shows a logical view of a set of hierarchically arranged elements 60 that is generated from the file 48, and that describes the design 50 in FIG. 2. The elements 60 are shown in an inverted tree arrangement 62 (hereinafter simply referred to as "tree") with a root element A at the top of the tree that corresponds to overall design 50. Each element 60, except the root element A, has one parent element (i.e., the element immediately above that element). Furthermore, each element 60 may have zero or more children elements (i.e., an element that is below that element). For example, element IO, which corresponds to a module instance "IO" as shown by the dashed line, has the root element A as its parent, and elements ack, DP1 and DP2 as its children.

The elements are stored as data structures in the memory 26, and are identified uniquely by an identifier (e.g., an ID number). Each element has a subname (i.e., a character string) that is unique from the perspective of that element's parent element. Each element's subname is stored in a field of a data structure for that element. Accordingly, each element also is identified uniquely by identifying that element's subname and parent element.

Figure 3:
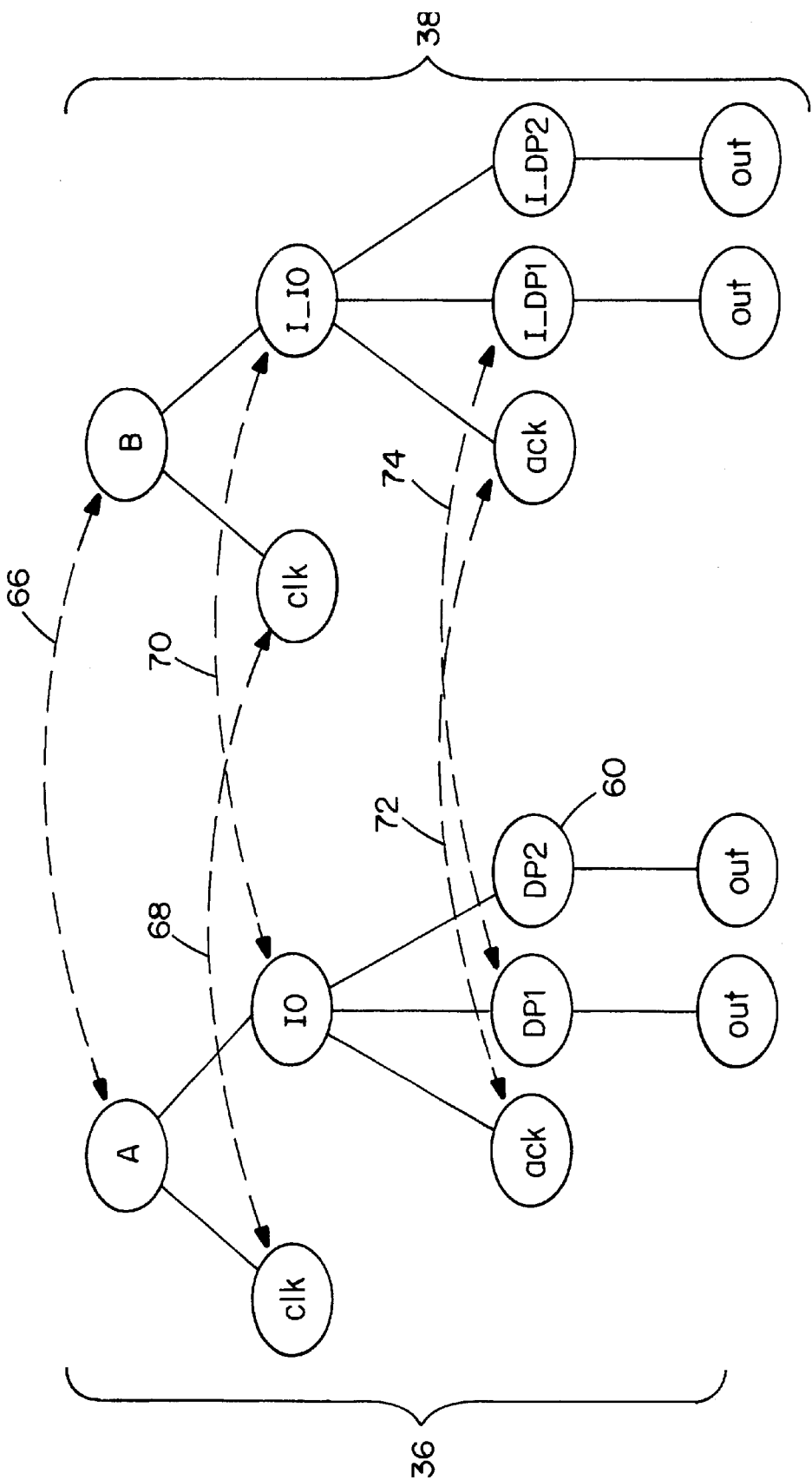
FIG. 3 is a diagram showing two hierarchical representations, and mappings indicating correspondences between elements of the two hierarchies according to the invention.

When a designer creates a new representation of a design from an old representation, the designer runs the program 34 on the computer 20 to verify that particular design aspects have been preserved in the new representation. FIG. 3 shows, by way of example, two representations that are suitable for processing by the invention program 34. The old representation 36 (the hierarchical arrangement 62 of elements 60) of the design 50 is indicated by a first hierarchy, i.e., the tree with root element A. The new representation 38 of the design is indicated by a second hierarchy, i.e., the tree with root element B. Elements of the first hierarchy correspond with elements of the second hierarchy. For example, the dashed line 66 indicates the correspondence between the two root elements A and B. The dashed lines 68, 70, 72 and 74 indicate other correspondences between the elements 60. Each element 60 is labeled its subname in FIG. 3. The form of the subnames of the elements 60 of the second representation 38 differ slightly from that of the first representation 36 in that the subnames of the module instances of the second representation 38 include a prefix "I_".

Figure 4:
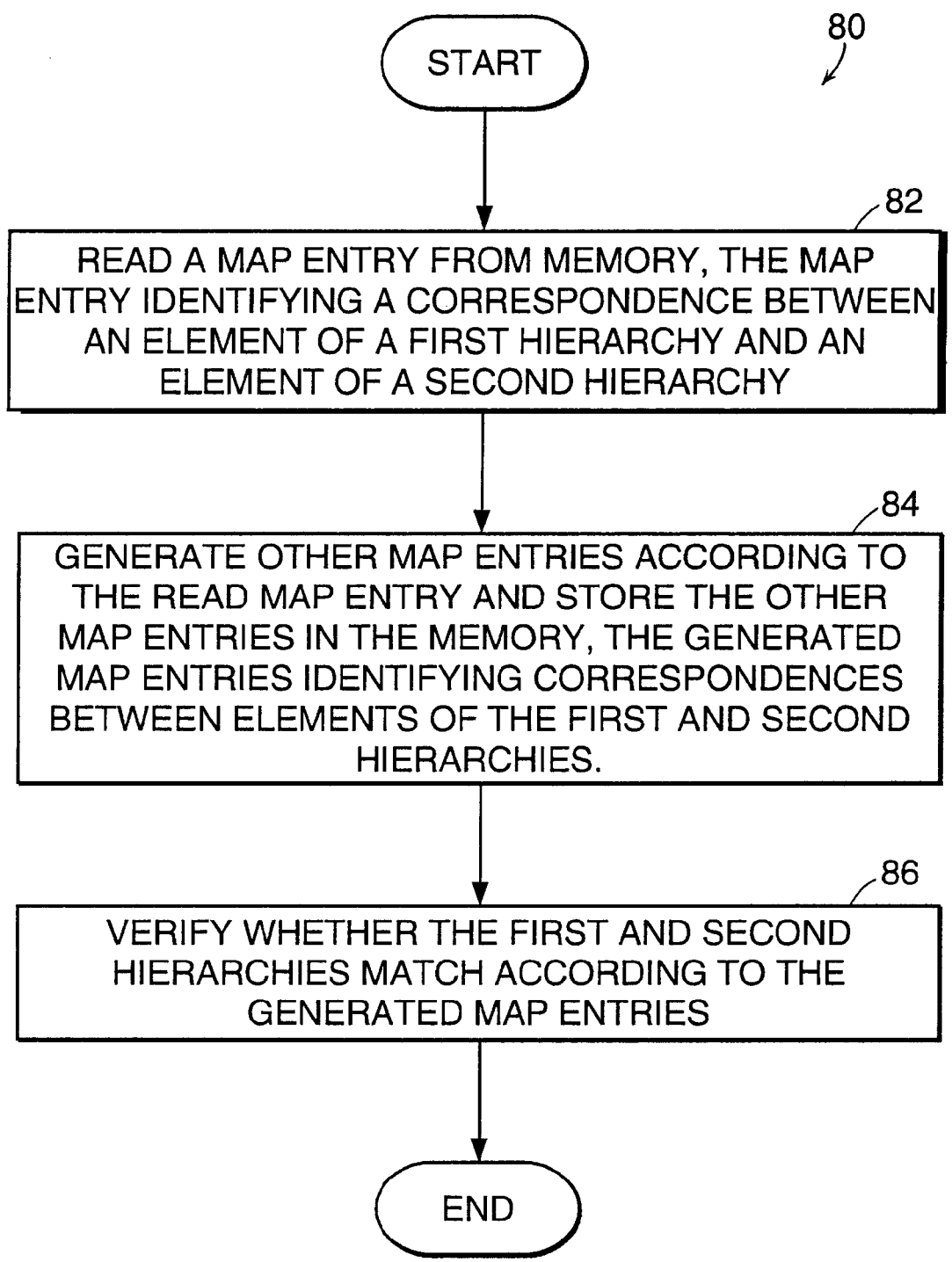
FIG. 4 is a flow diagram of a design verification method according to the invention.

When the designer instructs the computer 20 to execute the design verification program 34, the computer operates as a design verification system and performs a method 80 as illustrated FIG. 4. The method involves (a) mapping a first hierarchy of elements that represents a design to a second hierarchy of elements that also represent the design, and (b) comparing the hierarchies based on the mapping of the hierarchies. The comparison results in an indication of whether behavior has been preserved between the two representations.

Specifically, beginning in step 82 of FIG. 4, the invention system reads the initial map entry 40 from memory 26. The map entry 40 is a data structure that includes an identifier of an element in the first hierarchy 36 and an identifier of an element in the second hierarchy 38. In the preferred embodiment, the root elements of the first and second hierarchies 36, 38 are identified by the initial map entry 40. In step 84, the system generates other map entries 42 according to the read initial map entry 40 and stores the other map entries 42 in the memory 26. Each map entry includes a pair of identifiers that identify an element in the first hierarchy 36 and a corresponding element in the second hierarchy 38. The initial map entry 40 and the generated map entries 42 form a set of map entries that are stored in the memory 26 in a mapping table. In step 86, the system compares the first and second hierarchies 36,38 according to the set of map entries stored in the mapping table. A result of this comparison indicates whether the first and second hierarchies 36,38 match.

Figure 5:
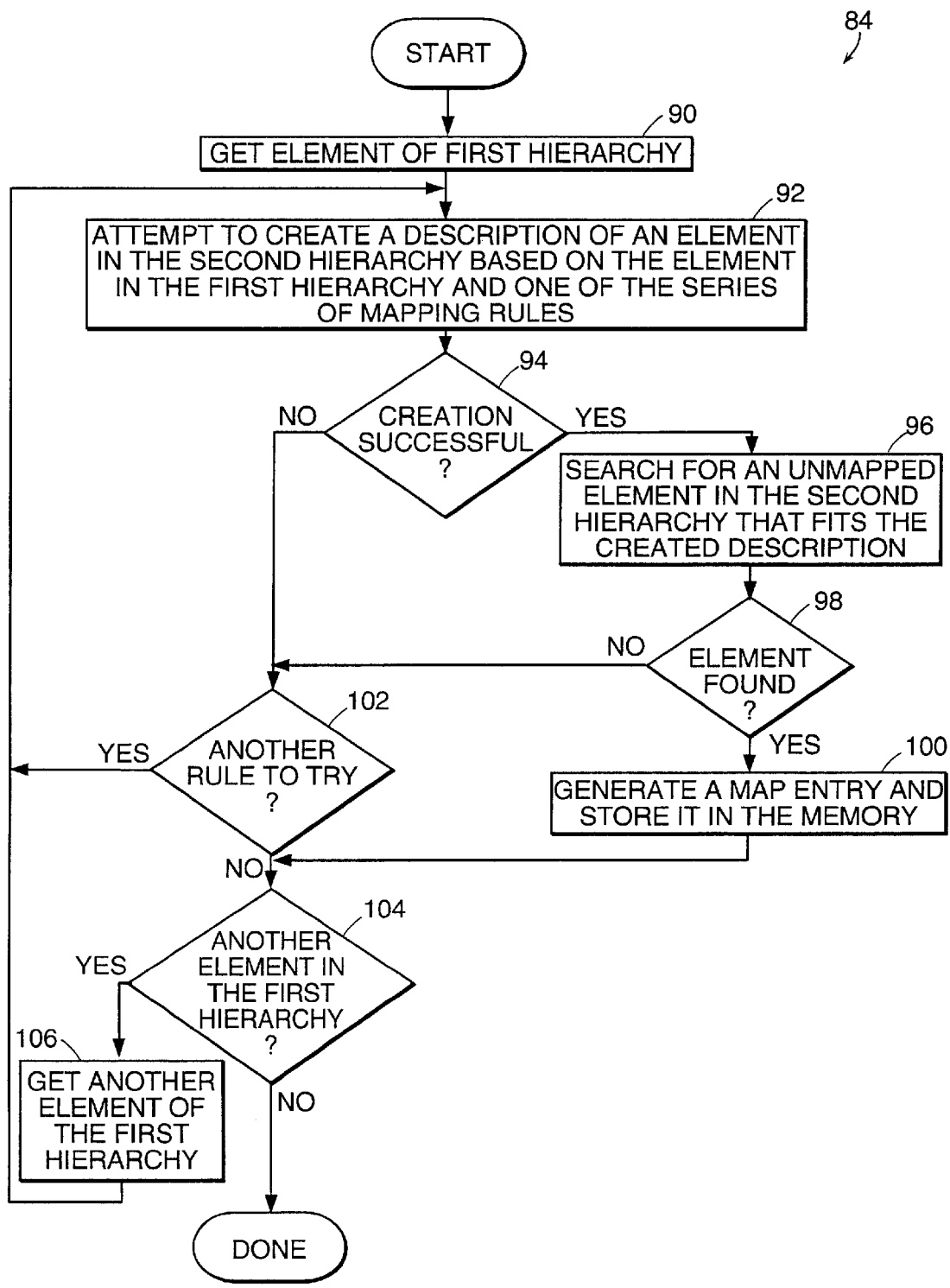
FIG. 5 is a flow diagram of an operation that generates map entries according to the invention.

Step 84 includes a set of steps that attempt to generate map entries individually, as illustrated in FIG. 5. In particular, in step 90, the system selects an element of the first hierarchy 36 for mapping. That is, the system selects a child element of the root element of the first hierarchy 36, the root element being identified by the initial map entry 40 read from the memory 26 in step 82.

In step 92, the system attempts to create an element description for an unmapped element of the second hierarchy according to the selected element of the first hierarchy 36 and one of a series of mapping rules 44. In the first pass of step 92, the first mapping rule in the series is used. As will be explained in detail later, the attempt may fail if the mapping rule is not appropriate for the selected element.

In step 94, the system determines whether the attempt was successful. If the attempt is successful, the system proceeds to step 96, and searches for an element of the second hierarchy 38 that fits the created description. In the first pass through these steps, 92, 94, 96 the system forms a path of the second hierarchy 38 describing a child of the root of the second hierarchy 38 using the initial map entry 40, and searches the second hierarchy 38 for an element whose path matches the formed path.

In step 98, the system determines whether an element of the second hierarchy 38 fitting the created description has been found. If an element of the second hierarchy 38 is found that fits the created description, the system proceeds to step 100, and generates a map entry including the identifier of the selected element of the first hierarchy 36 and the identifier of the found element of the second hierarchy 38, and stores the generated map entry in the memory 26. Then, in step 104, the system checks to see if other elements of the first hierarchy 36 need mapping. If so, the system proceeds to step 106 to select another element of the first hierarchy 36, and then to step 92, again. If there are no elements of the first hierarchy 36 left, step 84 completes.

In step 98, if no element of the second hierarchy 38 was found to fit the created description, the system proceeds to step 102 to determine if another mapping rule is available in the series 44. If so, the steps from 92 on are repeated using the next mapping rule in the series 44. If not, the system is through trying to map the selected element of the first hierarchy 36.

In step 94, if the system failed to create an element description, the system proceeds to step 102 to determine if there is another mapping rule in the series of mapping rules 44. If so, the system re-attempts to create an element description using the next mapping rule in the series 44. If not, the system is through trying to map the selected element and proceeds to step 104 to check if there are other elements in the first hierarchy 36 left to be mapped.

Figure 6:
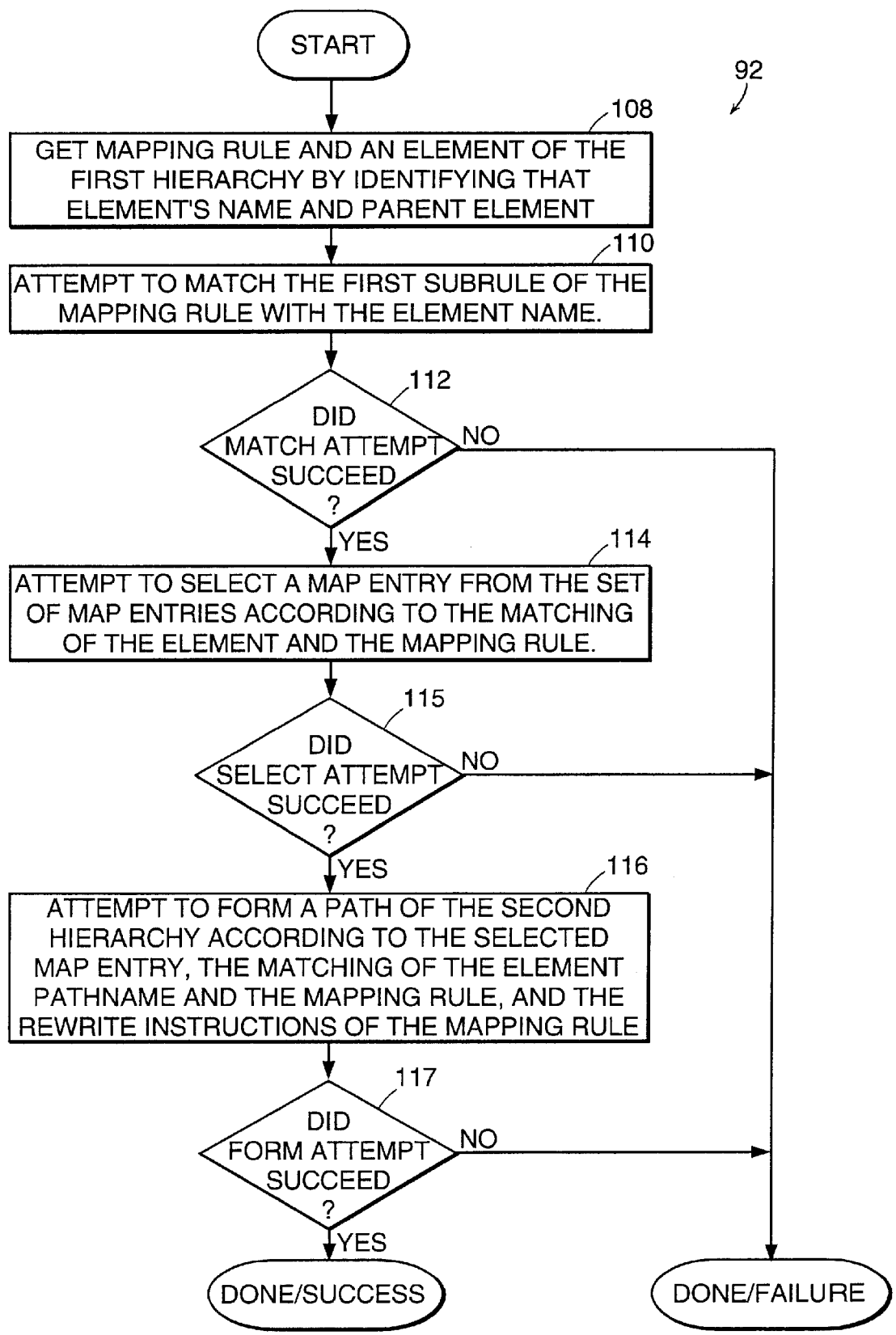
FIG. 6 is a flow diagram of an operation that attempts to create an element description according to the invention.

The first pass through steps 92–106 of FIG. 6 tries to map a child element of the root element of the first hierarchy 36 with a child element of the root element of the second hierarchy 38. Subsequent passes through these steps attempt to map other elements of the first hierarchy 36 to corresponding elements of the second hierarchy 38. These passes are continued until the system has tried to map each element of the first hierarchy 36.

According to an embodiment of the invention, the system attempts to map the elements of the first hierarchy 36 beginning with a child element of the root element in a top-down, depth-first manner. In particular, if the child is successfully mapped, the system attempts to map a child of the child element if any exist, and so on. When the system cannot proceed further down the hierarchy, the system attempts to map a sibling of the last mapped child element if one exists, and then proceeds down a path of that sibling. If no siblings exist, the system tries to map siblings of the parent element if any exist, and so on. This depth-first scheme is easily implemented by structuring step 84 (FIG. 5) as a recursive method or function.

It should be understood that each map entry that is generated relied on the initially read map entry 40 identifying the root elements of the first and second hierarchies 36, 38. In particular, the map entries for the child elements of the root elements were generated directly from the initially read map entry 40. Other map entries were then generated from those map entries, and so on.

Returning to FIG. 5, further details of step 92 will now be provided. In step 92, the system attempts to create an element description that identifies an element of the second hierarchy 38. The description includes a path of the second hierarchy 38 that is determined by a matching of subnames identifying the element in the first hierarchy 36 with one of the mapping rules 44. In particular, step 92 includes a series of steps, as illustrated in FIG. 6.

Beginning with step 108, the system gets a mapping rule and an element of the first hierarchy 36. The element of the first hierarchy 36 is identified by that element's path name, i.e., a series of subnames, being the names of the instances on the path to the element and the name of the element itself. In step 110, the system attempts to match the mapping rule with the element path name. In step 112, the system determines whether the matching was successful. If not, step 92 completes and the creation is considered to have failed. If so, in step 114, the system tries to select a map entry from the set of map entries 40, 42 according to the matching of the element path name and the mapping rule. In step 115, the system determines whether the selection was successful. If not, step 92 completes and the creation is considered to have failed. If so, in step 116, the system attempts to form a path of the second hierarchy 38 according to the selected map entry, the matching of the element path name and the mapping rule, and the rewrite instructions of the mapping rule (a subrule of the mapping rule that will be discussed later). This path will be used by the system later in step 96 to narrow a search for an element of the second hierarchy 38 that corresponds to the element of the first hierarchy 36. In step 117, the system determines whether the forming attempt was successful. If not, step 92 completes and the creation is considered to have failed. If so, step 92 completes and the creation is considered successful.

In step 110, when the system attempts to match the mapping rule with the element name, the way in which the system attempts the match is dependent on the type of mapping rule used. Each mapping rule in the series of mapping rules is an instruction having a keyword, a first subrule and a second subrule (i.e., the rewrite instruction). Each subrule includes a series of patterns delimited by a delimiter such as a period ".". A pattern is either a standard pattern or a wildcard pattern. A standard pattern includes one or more fields. A field may be a literal field or a match field.

If the mapping rule does not include a wildcard pattern, the system attempts to match the first subrule with the element path name by parsing the path name into subnames, and comparing each standard pattern of the subrule to a corresponding subname. For a literal field in a pattern, the literal field must match a portion of the subname character by character. For a match field in the pattern, the match field must match a portion of the subname in a manner similar to that used by %s and %d in the scanf function of the C programming language. If the first subrule matches with the element name, the attempt is considered successful. Otherwise, the attempt is considered to have failed.

If the mapping rule includes a wildcard pattern, the system parses the element path name into subnames, and attempts to match the non-wildcard patterns to the corresponding subnames. Then, the system matches the wildcard pattern to the remaining subnames. The wildcard pattern can match with either (a) zero subnames, or (b) one or more subnames. The attempt is successful if the system matches the non-wildcard patterns with the corresponding subnames. Otherwise, the attempt is considered to have failed.

Figure 7:
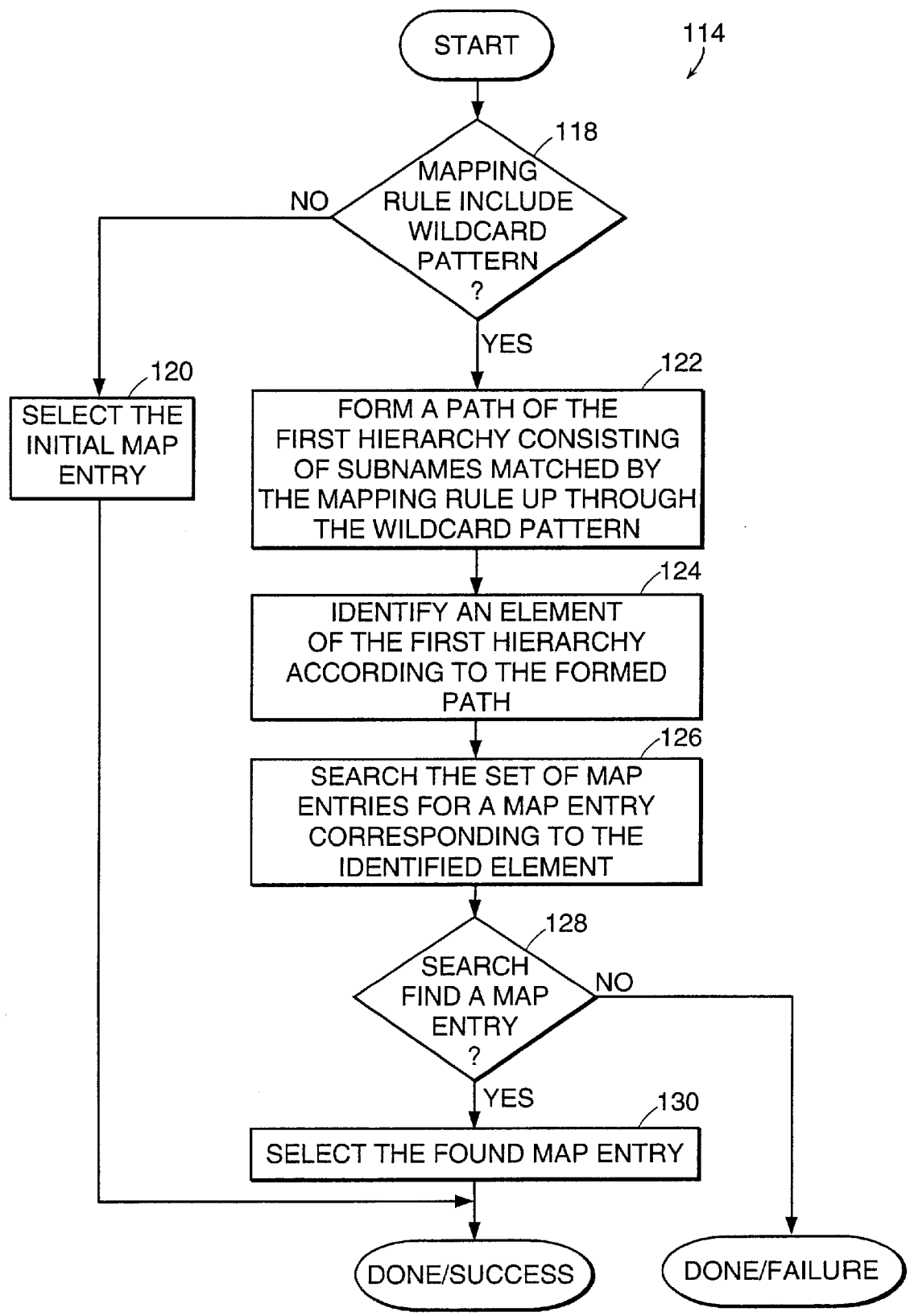
FIG. 7 is a flow diagram of an operation that attempts to select a map entry from a set of map entries based on an identified path according to the invention.

In step 114, when the system attempts to select a map entry according to the matching of the element path name and the mapping rule, the way in which the system tries to select a map entry is dependent on the type of mapping rule used, as illustrated in FIG. 7.

In step 118, if the mapping rule does not include a wildcard pattern, the system proceeds to step 120 which selects the initial map entry 40. Then, step 114 completes with the selection considered successful.

If the mapping rule includes a wildcard pattern, the system tries to select a map entry in multiple steps, as follows. First, in step 122, the system forms a path of the first hierarchy 36 consisting of the subnames matched by the mapping rule up through the wildcard pattern. Next, in step 124, the system identifies an element of the first hierarchy 36 according to the formed path. Then, in step 126, the system searches the set of map entries 40, 42 for a map entry corresponding to the identified element. In step 128, the system determines whether the search found a map entry. If a map entry is found, the system proceeds to step 130 which selects the map entry and step 114 completes with the selection considered successful. Otherwise, step 114 completes with the selection considered to have failed.

Since step 84 traverses the first hierarchy 36 in a top-down manner, it is guaranteed that, if the system will ever create a map entry corresponding to the element identified in step 124, it will have done so by the time this step is performed.

It should be understood that if the wildcard pattern matched zero subnames, the path formed by the system consists of the subnames matched by the mapping rule up to the wildcard pattern, there being no subnames matched by the wildcard pattern to include in the formed path.

Figure 8:
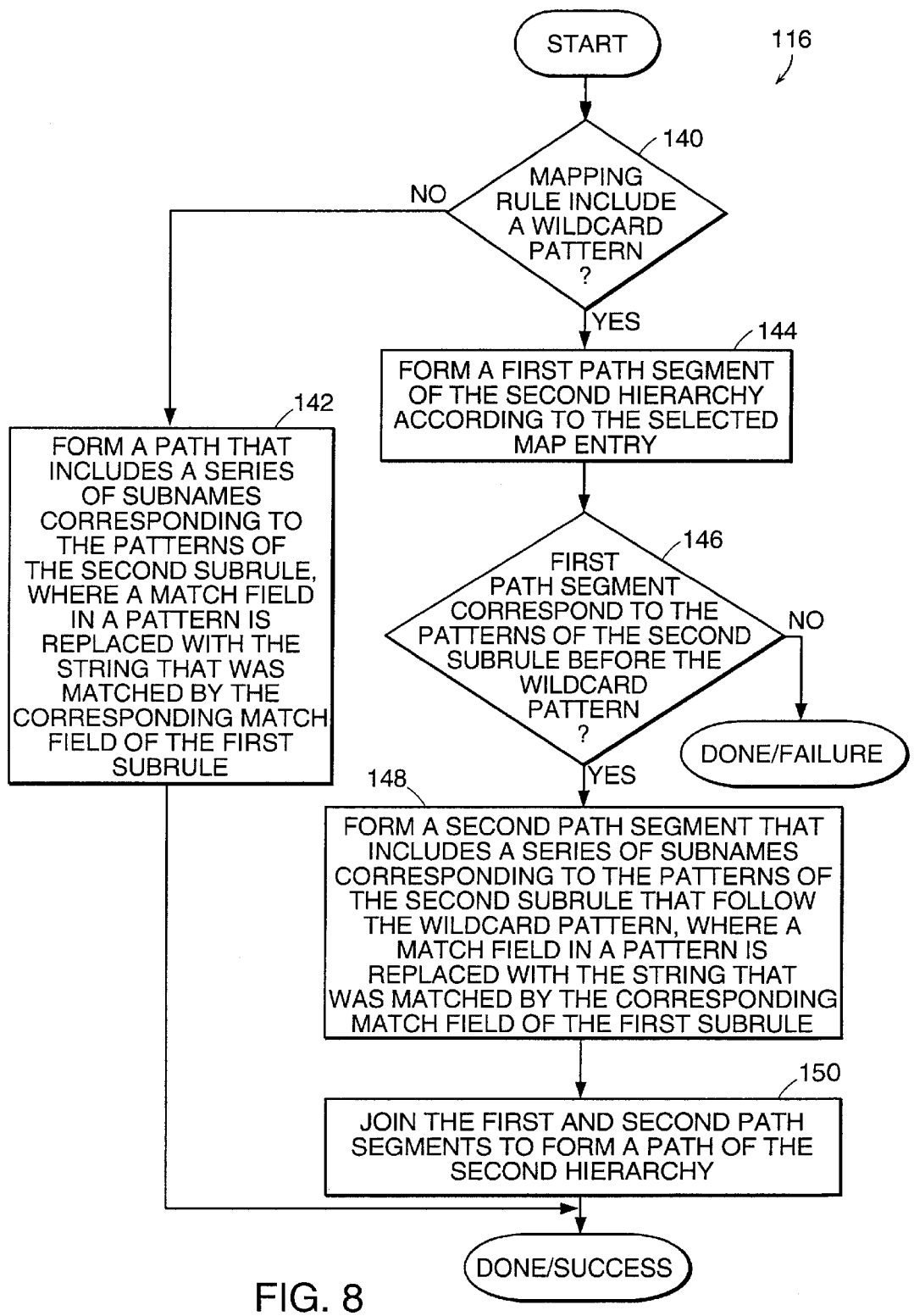
FIG. 8 is a flow diagram of an operation that attempts to form a path in a hierarchy according to the invention.

In step 116 (see FIG. 6), when the system attempts to form a path of the second hierarchy 38 according to the selected map entry, the matching of the element path name and the mapping rule, and the rewrite instructions of the mapping rule, the way in which the system attempts to form a path is dependent on the type of mapping rule used, as illustrated in FIG. 8.

In step 140, if the mapping rule does not include a wildcard pattern the system proceeds to step 142, which forms a path of the second hierarchy 38 according to the patterns of the second subrule, and step 116 completes with the forming considered successful. In particular, the system forms a path that includes a series of subnames corresponding to the patterns of the second subrule, where a match field in a pattern is replaced with the string that was matched by the corresponding match field of the first subrule.

If the mapping rule includes a wildcard pattern, the system attempts to form a path in multiple steps, as follows. First, in step 144, the system forms a first path segment of the second hierarchy 38 as the path to an element of the second hierarchy 38 according to the selected map entry. Second, in step 146, the system checks that the first path segment corresponds to the patterns of the second subrule before the wildcard pattern. In particular, the system checks that each subname of the first path segment matches the corresponding pattern of the second subrule, where a match field in the pattern is replaced with the string that was matched by the corresponding match field of the first subrule. If the check fails, step 116 completes with the forming considered to have failed. If the check succeeds, the system proceeds to step 148 which forms a second path segment of the second hierarchy 38 according to the patterns of the second subrule. In particular, the system forms a path segment that includes a series of subnames corresponding to the patterns of the second subrule that follow the wildcard pattern, where a match field in a pattern is replaced with the string that was matched by the corresponding match field of the first subrule. Next, in step 150, the system joins the first and second path segments to form a path of the second hierarchy 38, and step 116 completes with the forming considered successful.

It should be understood that the first path segment may consist of more subnames than there are patterns of the second subrule before the wildcard pattern. The system checks the correspondence of subnames and patterns until there are no more patterns. Any remaining subnames correspond to the wildcard pattern, for which no check is necessary.

It should be understood that due to the manner in which a mapping rule having a wildcard pattern is applied to elements of the first hierarchy 36, the system is capable of mapping elements of the first representation with elements of the second representation using one subrule when each subname is changed in the same way, such as by the addition of a prefix. This feature of the invention will now be described by way of example.

Suppose that a user intends to run the system on the two hierarchies 36, 38 shown in FIG. 3. The user may use the mapping rule:

$$\text{map\_instances A} \ldots \%s \text{ B} \ldots \text{I\_\%1s} \tag{4}$$

to map each of the instance elements of the hierarchies 36, 38 except for the root elements which are mapped initially before mapping the other elements. The keyword "map_instances" indicates that the instruction is a rule for mapping instance elements. The first subrule "A . . . %s" includes three patterns, each pattern being delimited by a period ".". The first pattern of the first subrule has one field which is literal field "A". The second pattern of the first subrule is a wildcard pattern denoted by ".". The wildcard pattern with its neighboring delimiters appears as an ellipsis (" . . . "). The third pattern of the first subrule has one field which is a match field "%s".

The second subrule includes three patterns. The first pattern of the second subrule has one field which is a literal field "B". The second pattern of the second subrule is a wildcard pattern ".". The third pattern of the second subrule has a literal field "I_" and a match field "%1s". The "1" in "%1s" indicates that the match field links with the first "%s" in the first subrule. It should be understood that, in contrast to the earlier described conventional rule-based signal matching tool, the delimiters are not part of the literal fields.

In step 110 (see FIG. 6), the system first applies mapping rule (4) to the instance element A.IO of FIG. 3. The element name of element A.IO is parsed into subnames "A" and "IO". The first pattern (literal field "A") is matched successfully with the subname "A". The third pattern (match field "%s") is matched successfully with the element subname "IO". The second pattern (the wildcard) is matched successfully with zero subnames in the element A.IO. Accordingly, the system considers the matching a success and selects a map entry from memory based on the matching (see steps 112 and 114 in FIG. 6). In particular, the system finds the map entry for the element identified by the path consisting of the subnames matched up through the wildcard, which in this case is the map entry for the root element A (FIG. 3). Further details of step 114 are illustrated in FIG. 7.

With reference to FIG. 7, in step 118, the system determines that mapping rule (4) includes a wildcard pattern, and proceeds to step 122. In step 122, the system forms a path of the first hierarchy that includes subnames matched by the mapping rule up through the wildcard pattern. At this point, the only subname matched up through the wildcard pattern is that of the root element A. Then, the system proceeds to step 124, which involves identifying an element of the first hierarchy according to the formed path, namely the root element A. Next, the system proceeds to step 126, which involves searching the set of map entries for a map entry corresponding to the identified element, the root element A. In this case, the system finds the initial map entry 40 (see FIG. 1), which maps the root element A with the root element B. In step 128, the system determines that a map entry is found and proceeds to step 130. In step 130, the system selects the initial map entry 40, and returns with an indication of success.

The system uses the selected map entry, along with the matching of the element path name and the mapping rule, and the rewrite instructions of the mapping rule to form a path of the second hierarchy 38 in step 116. The details of step 116 are illustrated in FIG. 8.

Referring to FIG. 8, since the mapping rule includes a wildcard pattern, the system forms a path of the second hierarchy 38 in four steps. First, in step 144, the system forms a first path segment as the path to an element of the second hierarchy 38 according to the selected map entry. In this case, the selected map entry is the initial map entry 40, so the first path segment consists of one subname corresponding to the root of the second hierarchy 38, i.e., "B". Next, in step 146, the system checks that the first path segment corresponds to the patterns of the second subrule before the wildcard pattern. In this case, the single subname of the first path segment ("B") matches the single pattern of the second subrule before the wildcard pattern ("B"), so the check succeeds and proceeds to step 148. In step 148, the system forms a second path segment of the second hierarchy 38 according to the patterns of the second subrule that follow the wildcard pattern, where match fields are replaced by strings that were matched by the first subrule. In this case, the single pattern following the wildcard pattern is I_%1s. The match field %1s is replaced with the string ("IO") that was matched by the corresponding match field of the first subrule. Thus, in this case, the second path segment consists of one subname, "I_IO". Then, in step 150, the system joins the first and second path segments to form a path of the second hierarchy 38. In this case the path consists of two subnames, "B.I_IO". The formed path of the second hierarchy is the description of an element of the second hierarchy 38 for which the system searches (see step 96 in FIG. 5).

In the example of FIG. 3, the system searches for an element identified by the path B.I_IO to map with element A.IO (see step 96 in FIG. 5). If such an element is found, the system generates a new map entry that maps element A.IO with element B.I_IO (see step 100 in FIG. 5).

The system later applies mapping rule (4) to the element A.IO.DP1 (FIG. 3). The element name of element A.IO.DP1 is parsed into subnames "A", "IO" and "DP1". The first subrule pattern (literal field "A") is matched successfully with the element subname "A". The third subrule pattern (match field "%s") is matched successfully with the element subname "DP1". The second subrule pattern (the wildcard) is matched successfully with one element subname, namely "IO". Accordingly, the system considers the matching a success.

Note that, for the element A.IO.DP1, one or more subnames match with the subrule wildcard. Therefore, the system attempts to select a map entry from the memory based on the subnames matching the wildcard (see step 114 in FIG. 6). In particular, the system finds the map entry for the parent element of element A.IO.DP1 which is identified by the path of the first hierarchy 36 consisting of the subnames matched by the patterns of the first subrule up through the wildcard pattern, i.e., "A.IO", since "IO" is the only currently stored subname matching the wildcard in memory 26. Accordingly, the system selects the map entry for element A.IO, (see steps 122–130 of FIG. 7). The system then forms a path of the second hierarchy 38 consisting of the subnames "B.I_IO.I__DP1" by joining a first path segment "B.I_IO" formed according to the selected map entry, and a second path segment "I_DP1" formed according to the patterns of the second subrule where the match field %1s is replaced with the string ("DP1") that was matched by the corresponding match field of the first subrule (see FIG. 8). The system then searches the second hierarchy 38 for an element that fits the description, i.e., the formed path "B.I_IO.I_DP1". If such an element is found, the system maps element A.IO.DP1 with element B.I_IO.I_DP1.

As described above, the system uses only one mapping rule to map elements of the first representation with elements of the second representation when they have a prefix added to each subname. Accordingly, the user does not need to provide a different mapping rule for each subname.

The system, as described above, tries to map an element of a first hierarchy to a second hierarchy using a mapping rule, and if the attempt fails, tries to map the same element using a new mapping rule, if available, (see FIG. 5). In an alternative embodiment, the system tries to map an element using a mapping rule, and if the attempt fails, tries to map another element, if available, using the same mapping rule. Such a procedure is illustrated in FIG. 9.

Figure 9:
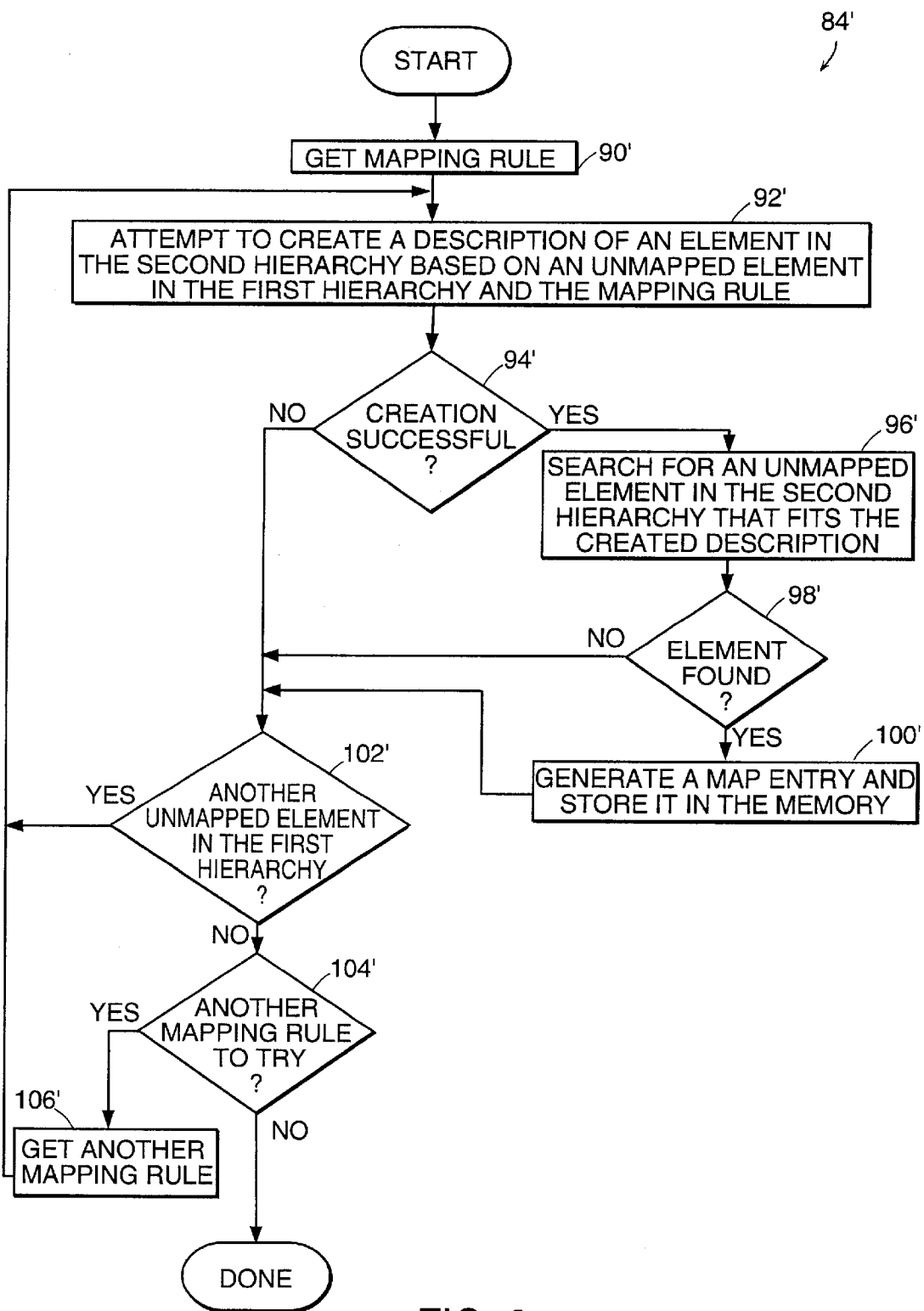
FIG. 9 is a flow diagram of an alternative operation that generates map entries according to the invention.

FIG. 9 is a flow diagram of an operation 84' that generates map entries. In particular, in step 90', the system gets a mapping rule. In step 92', the system attempts to create a description of an element in a second hierarchy based on an unmapped element in a first hierarchy and the mapping rule. In step 94' the system determines whether the attempt to create the description was successful. If so, in step 96' the system searches for an unmapped element in the second hierarchy fitting the created description. In step 98', the system determines whether an element was found. If so, in step 100' the system generates a map entry and stores it in the memory. In step 102', the system determines whether another unmapped element in the first hierarchy is available. If so, the system proceeds back to step 92' to attempt to create a description for the new element using the same mapping rule. Otherwise, step 102' proceeds to step 104'. In step 104' the system determines whether other mapping rules are available. If so, in step 106', the system gets another mapping rule, and proceeds back to step 92'. Accordingly, the system tries to map each element of the first hierarchy using one mapping rule, before trying another mapping rule. If the system determines that another mapping rule is not available in step 104', the procedure 84' completes.

In step 94' if the attempt to create a description is unsuccessful, the system proceeds to step 102'. Similarly, in step 98' if an element is not found, the system proceeds to step 102'.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

For example, the design verification system uses a previously stored map entry 40. This map entry may be provided manually by the user. It should be understood that the map entry 40 does not need to indicate a mapping of root elements. For example, the user may provide a map entry that maps an intermediate element located in the middle of the first hierarchy 36 with an intermediate element located in the middle of the second hierarchy 38. In such a case, the system can operate as if each element was a root element and maps the portions of the hierarchies 36, 38 below the intermediate elements.

Furthermore, it should be understood that the design verification system was described above using one wildcard in each subrule for simplicity. The system may be modified to include more than one wildcard in each subrule, and such a system is intended to be within the scope of the invention.

Additionally, the design verification system was described above as referencing elements by their character string names, each having a series of subnames separated by delimiters. Alternatively, the system may be modified to reference elements by their identifiers, or by the identifiers of their parents and the names of the elements within the parents, and such modifications are intended to be within the scope of the invention.

Furthermore, it should be understood that optimizations can be made to the system. For example, the system can be modified to detect specific types of mapping situations that do not require certain steps to be performed. In such cases, the non-required steps can be skipped. Accordingly, system resources such as processing cycles are saved.

It should be understood that the series of mapping rules provides an order of priority in which to apply the rules. If there is a one-to-one correspondence between elements of the first hierarchy and elements of the second hierarchy, the user should select the order of the mapping rules based on the user's desired mapping of elements. In particular, the mapping rules should be ordered such that an improper mapping does not occur which will prevent a correct mapping from occurring.

Although the system was described above such that each element of the first hierarchy 36 corresponds to an element of the second hierarchy 38, the system may map an element of the first hierarchy 36 with multiple elements in the second hierarchy 38. To this end, once an element has been mapped, the system continues to attempt to map it again. In particular, the system may create other matches by using different mapping rules. For such "multiple mapping" of elements, the procedure 84 in FIG. 5, for example, is modified so that step 100 proceeds to step 102 rather than step 104. This enables the system to attempt another mapping of the same element using another mapping rule. In the alternative procedure 84' in FIG. 9, for example, the system attempts multiple mapping when the restriction of using unmapped elements in steps 92' and 102' are removed. That is, when the system attempts to create descriptions based on previously mapped elements in the first hierarchy, multiple mapping attempts are performed. Accordingly, the system applies each mapping rule in an attempt to map the elements of the first hierarchy 36 to multiple elements of the second hierarchy 38.

Similarly, the system may map multiple elements in the first hierarchy 36 with a single element in the second hierarchy 38. Here, the system does not ignore elements of the second hierarchy 38 that have already been mapped (see step 96 in FIG. 5, and step 96' in FIG. 9). Rather, if the element of the second hierarchy 38 can be mapped with an element of the first hierarchy even though it has already been mapped at least once, the system maps that element another time.

Furthermore, the system may perform design verification on a first representation that is in hierarchical form and a second representation that describes the subject design in a single level of hierarchy. Here, the system creates a hierarchy template, i.e., an unpopulated hierarchy of elements. Then, the system populates the template with information from the second representation. By populating the template, the second representation is mapped with the first representation, i.e., the set of map entries has been generated. Accordingly, the system is ready to compare the representations according to the map entries.

It should be understood that a step that is not necessarily dependent on the completion of an earlier described step does not need to wait for the completion before starting. For example, portions of steps 84 and 86 (FIG. 4) may be performed simultaneously or in parallel. That is, after some map entries have been generated by the system, the system may begin comparing portions of the hierarchies based on those map entries even if all of the map entries have not yet been generated.

Furthermore, the invention may be applied to mapping representations other than VLSI circuit design representations. For example, hierarchically arranged designs such as mechanical and architectural designs may be mapped using the invention.

Additionally, the system was described as proceeding through hierarchy mappings in a top-down, depth-first manner. Alternatively, the system may attempt to map the elements in a top-down, breadth-first manner. That is, the system first attempts to map sibling elements, and then subsequently maps children elements of the siblings.

It should be understood that, when the design verification system matches a first hierarchy with a second hierarchy, the first hierarchy can be an original representation, and the second hierarchy can be a representation derived from the original representation. Alternatively, the second hierarchy can be an original representation, and the first hierarchy can be a representation derived from the original representation. As another alternative, each of the first and second hierarchies can be an original representation.

Furthermore, it should be understood that the pattern syntax and semantics used in the mapping rules described above were provided by way of example only. Alternative pattern syntax and semantics can be used.

What is claimed is:

1. In a digital processing system having a memory that stores a map entry, a first hierarchy of elements, and a second hierarchy of elements, the first hierarchy being a first representation of a circuit design, the second hierarchy being a second representation of the circuit design, the elements representing module instances and signals, a method for verifying whether the first representation matches the second representation, the method comprising the steps of:

reading the map entry from the memory, the map entry identifying a correspondence between an element of the first hierarchy and an element of the second hierarchy;

using mapping rules directed to match elements in said hierarchies of elements where any given mapping rule spans plural levels of said hierarchies, generating other map entries according to the read map entry, and storing the generated other map entries in the memory such that the map entry and the generated other map entries together form a set of map entries stored in the memory, the generated other map entries identifying other correspondences between the elements of the first hierarchy and the elements of the second hierarchy; and comparing the first representation with the second representation according to the set of map entries, a result of a comparison between the first and second representations indicating whether the first representation matches with the second representation.

2. The method of claim 1, wherein the step of reading the map entry includes a step of:

reading, as the map entry, a first identifier that identifies a root element of the first hierarchy and a second identifier that identifies a root element of the second hierarchy.

3. The method of claim 1, wherein the step of generating and storing includes the steps of:

attempting to create an element description of an element in the second hierarchy based on a first element in the first hierarchy and a mapping rule;

when the description is created, searching for a second element in the second hierarchy fitting the created description; and when the second element in the second hierarchy is found, generating a map entry indicating a correspondence between the first element in the first hierarchy and the second element in the second hierarchy.

4. The method of claim 3, wherein the step of generating and storing further includes the step of:

when one of the step of attempting and the step of searching is unsuccessful, re-attempting to create the element description based on the first element in the first hierarchy and another mapping rule.

5. The method of claim 3, wherein the step of attempting to create includes the steps of:

attempting to match a first subrule of the mapping rule with a name of the first element of the first hierarchy;

when the first subrule matches the name, attempting to select a map entry from the set of map entries according to the matching of the first subrule and the name; and when the map entry is selected, attempting to form a path of the second hierarchy according to the selected map entry, the matching of the first subrule and the name, and a second subrule of the mapping rule.

6. The method of claim 5, wherein the mapping rule includes a wildcard pattern that matches one of zero subnames, one subname and multiple subnames; and wherein the step of attempting to select includes the steps of:

forming a path of the first hierarchy according to the mapping rule that includes the wildcard pattern;

identifying an element of the first hierarchy according to the formed path;

searching the set of map entries for a map entry corresponding to the identified element; and when a map entry is found, selecting the found map entry.

7. The method of claim 5, wherein the step of attempting to form the path includes the steps of:

forming a first path segment of the second hierarchy according to the selected map entry;

when the first path segment corresponds to patterns in the second subrule, forming a second path segment corresponding to patterns in the second subrule; and combining the first and second path segments to form a path of the second hierarchy.

8. The method of claim 1, wherein the memory further stores a mapping rule having a wildcard pattern, and wherein the step of generating and storing includes the step of:

matching the wildcard pattern of the mapping rule to one of zero subnames, one subname and multiple subnames.

9. The method of claim 1, wherein the memory further stores a mapping rule, and wherein the step of generating and storing includes the step of:

attempting to create an element description according to the mapping rule and a description of a first element of the first hierarchy, and when an element description is created, searching for a second element of the second hierarchy that fits the element description, and when the second element is found, generating a new map entry identifying a correspondence between the first and second elements; and repeating the step of attempting, searching and generating with another first element of the first hierarchy upon one of (a) the step of attempting to create failing and (b) the step of searching for a second element failing, and ending the step of repeating when the step of attempting, searching and generating has been performed for each element of the first hierarchy.

10. The method of claim 1, wherein the step of generating and storing includes the steps of:

mapping a parent element of the first hierarchy with an element of the second hierarchy; and subsequently mapping a child element of the first hierarchy with another element of the second hierarchy, the child element being a child of the parent element.

11. A circuit design verification system for verifying whether a first representation of a design matches with a second representation of the design, the design verification system, comprising:

a working memory that stores a first hierarchy of elements as the first representation of the design, a second hierarchy of elements as the second representation of the design, and a map entry that identifies a correspondence between an element of the first hierarchy and an element of the second hierarchy, the elements representing module instances and signals; and a processing assembly executable by a digital processor to:

read the map entry from the memory;

by using mapping rules directed to match elements in said hierarchies of elements where any given rule spans plural levels of said hierarchies, generate other map entries according to the read map entry, and store the generated other map entries in the memory such that the map entry and the generated other map entries together form a set of map entries stored in the memory, the generated other map entries identifying other correspondences between the elements of the first hierarchy and the elements of the second hierarchy; and compare the first representation with the second representation according to the set of map entries, a result of a comparison between the first and second representations indicating whether the first representation matches with the second representation.

12. The design verification system of claim 11, wherein the map entry stored in the memory includes:

a first identifier that identifies a root element of the first hierarchy; and a second identifier that identifies a root element of the second hierarchy.

13. The design verification system of claim 11, wherein the processing assembly, when generating the other map entries, performs:

a create operation that attempts to create an element description of an element in the second hierarchy based on a first element in the first hierarchy and a mapping rule;

a search operation that, when the description is created, searches for a second element in the second hierarchy fitting the created description; and a generate operation that, when the second element in the second hierarchy is found, generates a map entry indicating a correspondence between the first element in the first hierarchy and the second element in the second hierarchy.

14. The design verification system of claim 13, wherein the processing assembly, when generating the other map entries, further performs:

a re-attempt operation that, when one of the create operation and the search operation is unsuccessful, re-attempts to create the element description based on the first element in the first hierarchy and another mapping rule.

15. The design verification system of claim 13, wherein the create operation includes:

a match operation that attempts to match a first subrule of the mapping rule with a name of the first element of the first hierarchy;

a select operation that, when the first subrule matches the name, attempts to select a map entry from the set of map entries according to the matching of the first subrule and the name; and a form operation that, when the map entry is selected, attempts to form a path of the second hierarchy according to the selected map entry, the matching of the first subrule and the name, and a second subrule of the mapping rule.

16. The design verification system of claim 15, wherein the mapping rule includes a wildcard pattern that matches one of zero subnames, one subname and multiple subnames; and wherein the select operation includes:

an operation that forms a path of the first hierarchy according to the mapping rule that includes the wildcard pattern;

an operation that identifies an element of the first hierarchy according to the formed path;

an operation that searches the set of map entries for a map entry corresponding to the identified element; and an operation that, when a map entry is found, selects the found map entry.

17. The design verification system of claim 15, wherein the form operation includes:

an operation that forms a first path segment of the second hierarchy according to the selected map entry;

an operation that, when the first path segment corresponds to patterns in the second subrule, forms a second path segment corresponding to patterns in the second subrule; and an operation that combines the first and second path segments to form a path of the second hierarchy.

18. The design verification system of claim 11, wherein the memory further stores a mapping rule having a wildcard pattern, and wherein the processing assembly, when generating the other map entries, performs:

a match operation that matches the wildcard pattern of the mapping rule to one of zero subnames, one subname and multiple subnames.

19. The design verification system of claim 11, wherein the memory further stores a mapping rule, and wherein the processing assembly, when generating the other map entries, performs:

a create operation that attempts to create an element description according to the mapping rule and a description of a first element of the first hierarchy, and when an element description is created, searches for a second element of the second hierarchy that fits the element description, and when the second element is found, generates a new map entry identifying a correspondence between the first and second elements, the create operation being repeatable for other elements of the first hierarchy upon one of (a) the attempt to create failing and (b) the search for a second element failing.

20. The design verification system of claim 11, wherein the processing assembly, when generating the other map entries, performs:

a mapping operation that maps a parent element of the first hierarchy with an element of the second hierarchy; and a subsequent mapping operation that maps a child element of the first hierarchy with another element of the second hierarchy, the child element being a child of the parent element.

21. In a digital processing system having a memory, a method for forming an element description, the method comprising the steps of:

reading a map entry from the memory, the map entry identifying a correspondence between a first element of a first hierarchy and a second element of a second hierarchy, a relationship existing between the first element and a third element of the first hierarchy; and creating an element description that describes a fourth element of the second hierarchy according to the read map entry and a mapping rule, the fourth element of the second hierarchy corresponding with the third element of the first hierarchy, a relationship existing between the second element and the fourth element that is identical to the relationship existing between the first and third elements, the mapping rule (i) directed to match elements in said hierarchies of elements and (ii) spanning plural levels of said hierarchies.

22. The method of claim 21, wherein the element description describes the fourth element of the second hierarchy according to the read map entry, the mapping rule and a description of the third element that includes a set of subnames; wherein the mapping rule includes a wildcard pattern that matches one of zero subnames and at least one subname; and wherein the step of creating includes the step of:

identifying a path of the second hierarchy according to a matching of the set of subnames with the mapping rule having the wildcard pattern.

23. In a design verification system, a method for generalizing mapping rules applied to comparing signal names, the method comprising:

mapping elements of a first representation and a second representation, said first and second representations being respective hierarchically arranged sets of said elements representing module instances and signals; and employing the mapping of said elements in mapping rules directed to match said elements in said hierarchically arranged sets of elements, any given rule spanning plural levels of said hierarchically arranged sets of elements.

* * * * *